United States Patent [19]

Livesay

[11] Patent Number: 5,468,595
[45] Date of Patent: Nov. 21, 1995

[54] METHOD FOR THREE-DIMENSIONAL CONTROL OF SOLUBILITY PROPERTIES OF RESIST LAYERS

[75] Inventor: William R. Livesay, San Diego, Calif.

[73] Assignee: Electron Vision Corporation, San Diego, Calif.

[21] Appl. No.: 202,446

[22] Filed: Feb. 28, 1994

Related U.S. Application Data

[63] Continuation-in-part of Ser. No. 11,158, Jan. 29, 1993.

[51] Int. Cl.$^6$ .............................. G03F 7/20; G03C 5/00; H01L 21/30
[52] U.S. Cl. .................... 430/296; 430/311; 430/325; 430/328; 430/394; 430/494; 430/942; 250/492.3
[58] Field of Search ........................ 430/296, 311, 430/313, 315, 324, 325, 328, 329, 394, 396, 942, 494; 250/492.1, 492.2, 492.3

[56] References Cited

U.S. PATENT DOCUMENTS

| 3,615,454 | 10/1971 | Cescon | 430/296 |
|---|---|---|---|
| 4,702,995 | 10/1987 | Okada | 430/394 |
| 4,814,244 | 3/1989 | Koguchi | 430/328 |

FOREIGN PATENT DOCUMENTS

| 57-40928 | 3/1982 | Japan | 430/296 |
|---|---|---|---|
| 57-42130 | 3/1982 | Japan | 430/296 |
| 57-1033186 | 6/1982 | Japan | 430/296 |
| 63-12156 | 1/1988 | Japan | 430/296 |

*Primary Examiner*—Kathleen Duda
*Attorney, Agent, or Firm*—Noel F. Heal

[57] ABSTRACT

An electron beam exposure method for controlling the solubility of resist layers used in a variety of lithography processes, to permit removal of the resist material from selected positions and depths in the resist. By controlling the energy of a uniform electron beam impinging on the resist, the method selects a resist depth for applying a dose of electrons, the effect of which is to change the solubility properties of the resist material at the selected positions and depths. Subsequent removal of unwanted portions of the resist produces desired resist wall slope and edge profiles in the developed patterns in photoresist. One embodiment of the invention uses the same basic method to produce three-dimensional structures in the resist material, including bridge-like structures in which lower layers are removed from beneath intact upper layers. In a variant of this embodiment, the same technique is used to form a three-dimensional mold in the resist material, and then three-dimensional structures of another material, such as metal are formed by filling the mold.

24 Claims, 10 Drawing Sheets

METHOD FOR THREE-DIMENSIONAL CONTROL OF SOLUBILITY PROPERTIES OF RESIST LAYERS

CROSS-REFERENCE TO RELATED APPLICATION

This is a continuation-in-part of application Ser. No. 08/011,158, filed on Jan. 29, 1993, having the same title as the present invention and subsequently abandoned in favor of this application.

BACKGROUND OF THE INVENTION

This invention relates generally to the fabrication of semiconductor devices using pattern lithography and, more specifically, to the control of pattern edge profiles in photoresist layers. The art of photolithography in the fine patterning of semiconductor substrates is well known. Examples of applications of photolithography are the formation of integrated circuits and the formation of magnetic recording heads.

In a conventional pattern forming process, a substrate is coated with a layer of a radiation sensitive composition called resist. Photoresist is the term used for resist materials that are sensitive to optical radiation. Similarly, electron resist materials are sensitive to electron radiation. The resist layer is exposed to electromagnetic radiation (i.e. light, X-rays, gamma rays, ions or electrons) to change the solubility characteristics of selected portions of the resist layer. A relief image is formed by action of a solvent to remove the more soluble portions of the radiation sensitive resist layer. Pattern formation is a result of the differential solubility between irradiated and non-irradiated regions. These solubility changes are produced by either bondbreaking (chain scission) or bond formation (chain crosslinking) in a polymeric resist. A positive acting resist will become more soluble via chain scission when irradiated. A negative resist will crosslink and become more insoluble when irradiated. Thus a positive resist is one in which the material remaining after exposure and development corresponds to the opaque portions of a mask used for selective radiation of the resist. A negative resist is one in which the material remaining after exposure and development corresponds to the transparent portions of the mask.

A critical operation in high resolution lithography is the transfer of the pattern defined in the resist, to a layer of other material in or on the substrate. There are many different kinds of pattern transfer processes, which may be additive or subtractive in nature. Subtractive processes involve an etching away of material using dry plasma, a chemical solution, or an ion beam. For example, FIG. 1a shows a substrate 20 with a layer 21 to be patterned, coated with resist 22. FIG. 1b shows the resist layer 22 being selectively exposed to radiation, indicated by the arrows 23, which degrades the resist in the area exposed, such as the area 24. The resist is next immersed in a weak solvent, which dissolves away the exposed region 24, leaving the relief pattern shown in FIG. 1c. The resist layer 22 than acts as a protective mask for the subsequent etching away of the material in layer 21 to be patterned, as shown in FIG. 1d. Remaining portions of the resist layer 22 are then stripped away in a strong solvent, leaving the desired pattern in layer 21 as shown in FIG. 1e.

Additive processes are those where material is deposited (via evaporation, electroplating, or ion implantation) after the resist has been patterned. In an additive or so called lift-off process, a metal is deposited (added) after resist patterning and then the resist is stripped off, leaving metal in the windowed areas of the resist. Such a process is shown in FIGS. 2a through 2e. In FIG. 2a, the substrate 20 is bare except for the resist layer 22. The resist is then exposed to patterned radiation 23, as shown in FIG. 2b. The exposed resist is then developed, i.e. dissolved in the exposed patterned areas, such as the area 24, as shown in FIG. 2c. A metal or other material 25 to be patterned is deposited on top of the resist layer 22. The metal adheres to the substrate 20 in the patterned regions, such as 24, as shown in FIG. 2d. The resist layer 22 is then removed (dissolved), carrying away the metal layer 25 everywhere except in the patterned regions 24, as shown in FIG. 2e. For this lift-off additive process, an undercut resist profile is desired to provide a clean discontinuity of the deposited metal layer 25.

Semiconductor fabrication processes have utilized many techniques to control the edge profile of resists. In some additive processes it is desirable to have an undercut edge profile. In some etching processes it is desirable to have a vertical wall profile. And in some processes a tapered edge slope is required. Prior to the present invention, changing the resist wall slope has required additional processing steps and multiple resist layers, adding to the complexity and cost of fabrication. Furthermore these additional processing steps, for example to achieve an undercut profile or vertical side walls, often decrease the overall manufacturing yield of the devices, i.e. the percentage of fully operational devices produced.

Electron beam pattern exposure typically provides an undercut profile when utilizing positive resists. Photon or optical exposure typically results in a tapered edge profile. Although an undercut profile is preferred for a lift-off process, it is not preferred for an electroplating process where an upward force can be generated that will lift up narrow lines of the metalized layer. It is therefore highly desirable to have some means for controlling the edge slope and resist profiles in high resolution lithography. Numerous workers in the field have devised processing means to control edge profiles. Without exception, these prior art techniques add complexity to the fabrication process, such as additional coating steps, multiple resist layers and so forth. In general, this additional complexity tends to degrade overall process yields.

An example of the prior art, shown in FIG. 3a, is a typical patterning step (not shown to scale). A substrate 20 is coated with resist 22 and exposed in the crosshatched area 24 to an exposure level designated Dose A. In an ideal process the resist profile (after development) will look as depicted in FIG. 3b, where the resist is removed in the area exposed 26, with the unexposed resist exhibiting vertical side walls 29 down to the substrate 20. In practice, however, when the resist 22 is being developed the developer acts as a weak solvent, also attacking the unexposed portions 22 of the resist, as well as the exposed portion 24. FIG. 3c shows how, during development, the corner edges of the resist 22 are attacked by the developer 28, both along the inside walls and on the top edge of the resist. This results in sloped or tapered sidewalls 30 in the developed resist image, as shown in FIG. 3d.

Undercut profiles may be obtained utilizing an electron beam to provide the primary patterning exposure, because the energy absorption in the resist layer during exposure is not linear, but reaches a maximum at about one-third of the beam penetration range. FIG. 4 shows a typical dose distribution curve as a function of depth into the resist. In optical exposure of photoresists, however, energy absorption is highest at the top of the resist layer and lowest at the interface between the resist and the underlying substrate, due to light attenuation in the resist. It is therefore ordinarily impossible to obtain an undercut profile or even a vertical profile with normal optical exposure and normal development of the commonly used positive photoresists.

One prior art technique utilizing a blanket exposure step requires two resist layers, including an upper layer formed on an underlying resist layer. The upper resist layer is first patterned and developed, and then acts as a mask for a flood ultraviolet exposure of the underlying resist layer. By adjusting the solubilities of the top and bottom layers, an undercut or tapered edge slope may be attained. The problem with this technique is that it is difficult to coat one resist on top of the other without distorting the underlaying resist. In some cases an additional (metal or inorganic) layer is added between the two resist layers to act as a barrier interface to separate the two different chemistries. This adds extra processing steps, with consequential yield loss.

It is the objective of this invention to provide an easily applied and controllable method for achieving defined edge profiles in resist. It is further the objective of this invention to provide a means of controlling edge profiles independent of the primary patterning step, without requiring any additional resist layers or additional processing steps other than a blanket exposure by a uniform electron beam. This blanket exposure can be performed before or after the pattern exposure step but prior to the development of the resist image. The object of this invention is to provide a means of controlling the edge profile of any resist pattern (exposed optically or by other means) by a simple blanket exposure with an electron beam.

SUMMARY OF THE INVENTION

The invention resides in the use of a large area, uniform electron beam and controlled accelerating voltage to expose resist in precisely controlled doses and at selected energies, to control the solubility of the resist at selected depths. Three-dimensional control of the resist solubility can be usefully employed to control the wall slope and edge profiles of developed patterns in photoresist, or to form three-dimensional microstructures in the resist. The resist can be exposed before or after patterning, to affect wall slope or edge profiles in the resist. Depositing a heavier dose in the bottom layer of a positive acting resist results in a developed pattern with undercut profiles at the pattern edges. Depositing a heavier dose in the upper portion of the resist results in developed patterns with have tapered side walls. A complementary exposure to compensate for the primary pattern lithography tool's distribution of dose (as a function of depth in the resist) controls the pattern edges to achieve vertical sidewalls or sidewalls sloped at any desired angle.

Another important embodiment of the invention uses a higher contrast process in which the resist is first exposed in a conventional optical lithography tool, such as a stepper or projection system. The resist is then developed and then doubly exposed with a blanket electron beam. The first electron beam exposure penetrates the entire resist layer with a low dose to make the resist more soluble. Then a low electron energy is utilized at high dose to make the upper layer of the resist insoluble. This allows the resist underneath the upper hardened layer, whose thickness is selectable by beam energy, to be dissolved in the developer, leaving an overhanging resist profile.

It will be understood by those skilled in the art of materials processing that the method of the invention also applies to materials other than those normally encompassed by the term "resist." Accordingly, as used herein "resist" is intended to include any polymers that can be cross-linked or degraded as a result of irradiation with an electron beam.

DESCRIPTION OF THE PREFERRED EMBODIMENTS

Figure 1A:
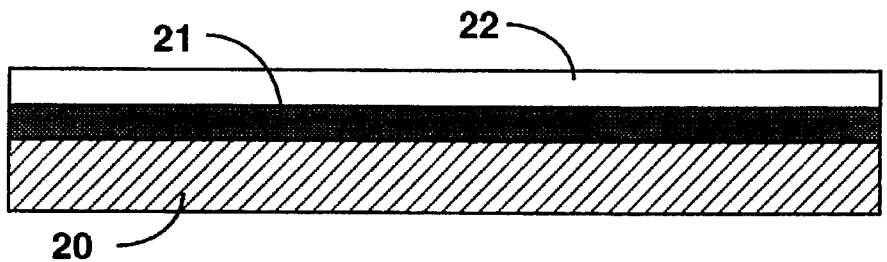
FIGS. 1a–1e are a sequence of simplified cross-sectional views illustrating typical subtractive etching process as used in conventional photolithography fabrication of semiconductor devices.
Figure 1B:
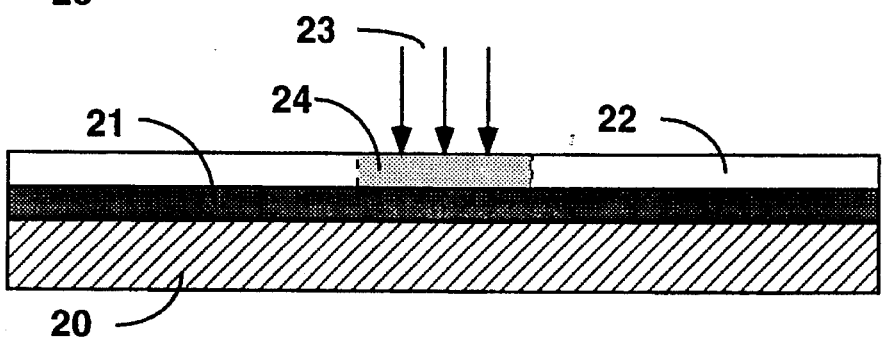
Figure 1C:
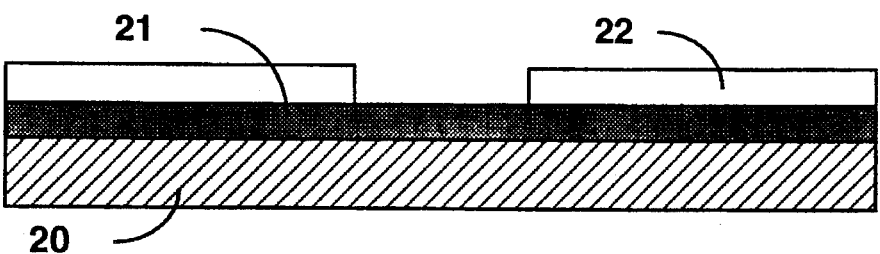
Figure 1D:
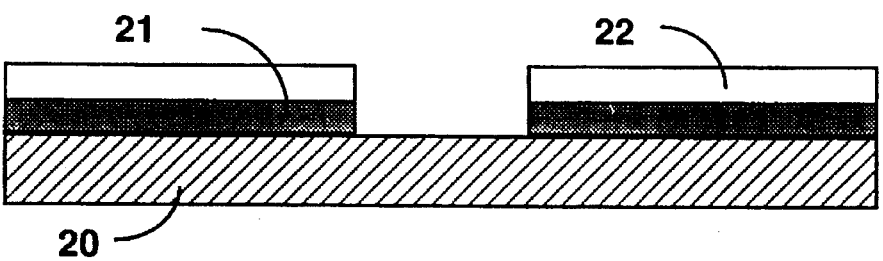
Figure 1E:
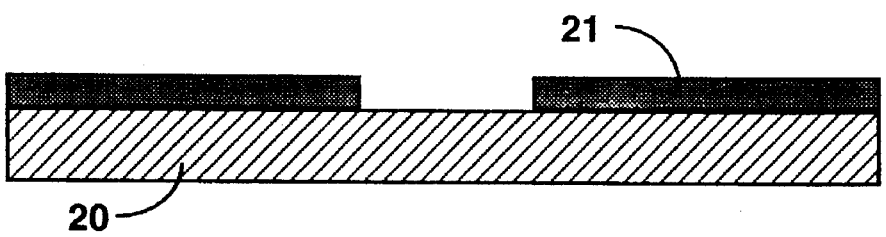
Figure 2A:
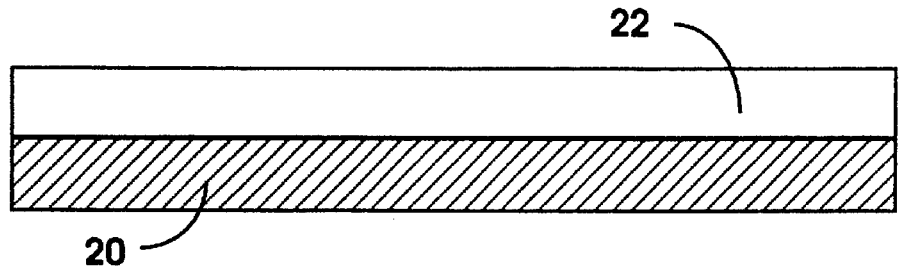
FIGS. 2a–2e are a sequence of cross-sectional views illustrating a typical additive or lift off photolithographic process.
Figure 2B:
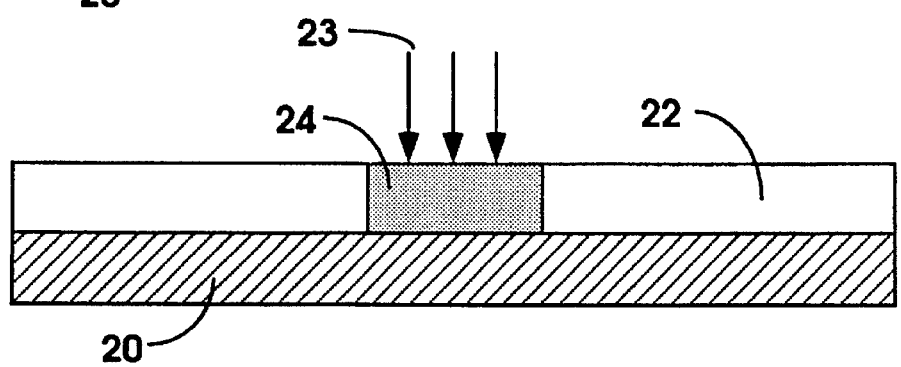
Figure 2C:
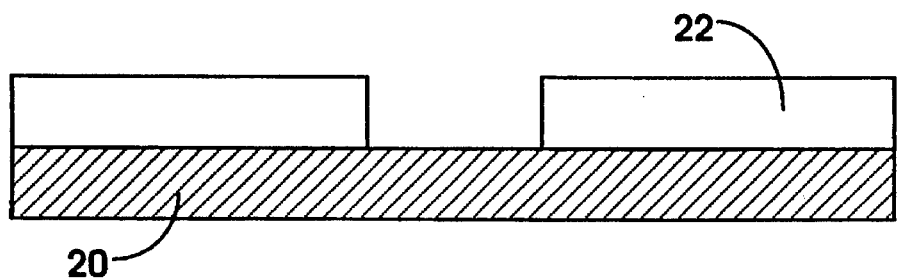
Figure 2D:
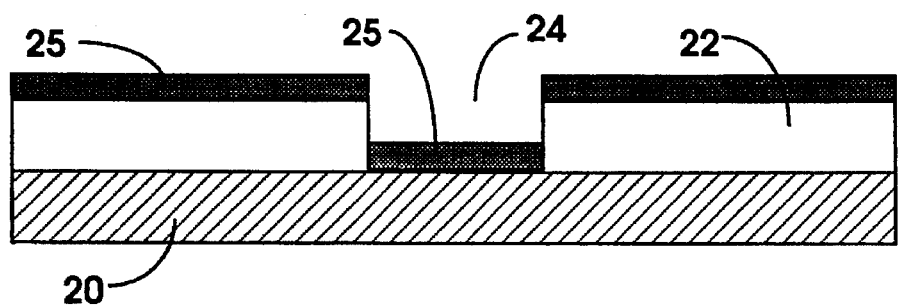
Figure 2E:
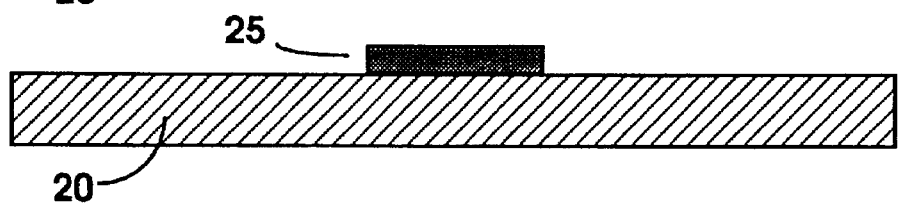
Figure 3A:
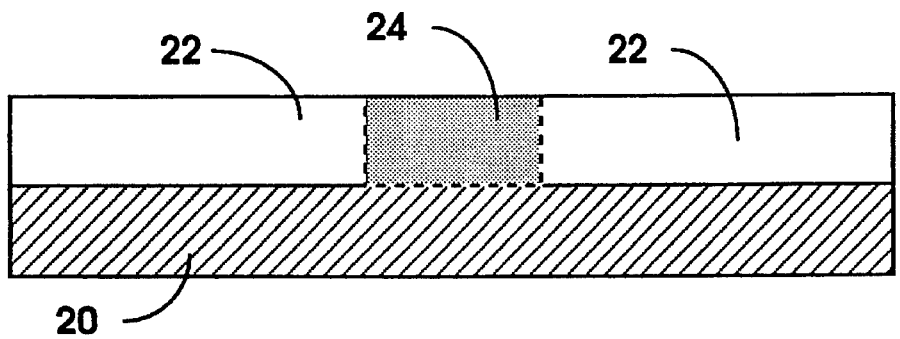
FIGS. 3a–3d are a sequence of cross-sectional views illustrating typical edge slope profiles of a resist layer in conventional processing.
Figure 3B:
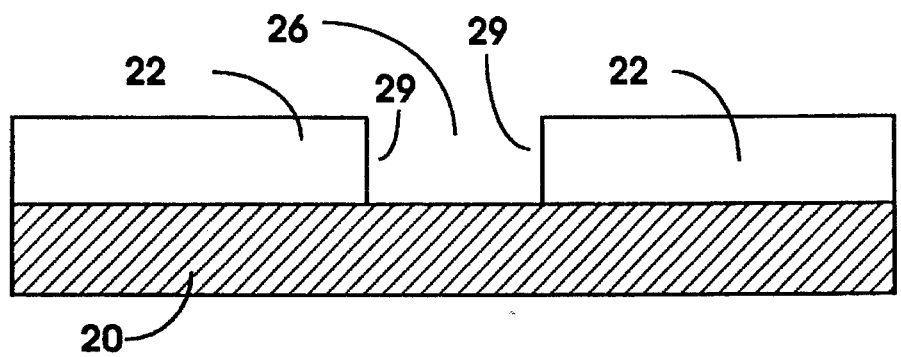
Figure 3C:
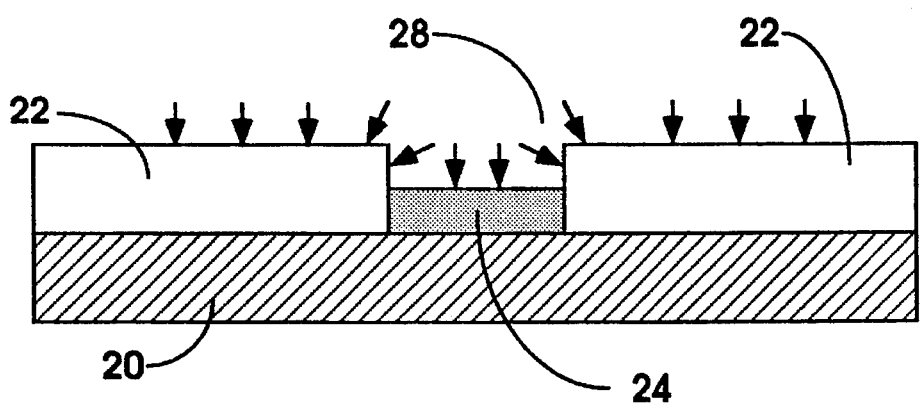
Figure 3D:
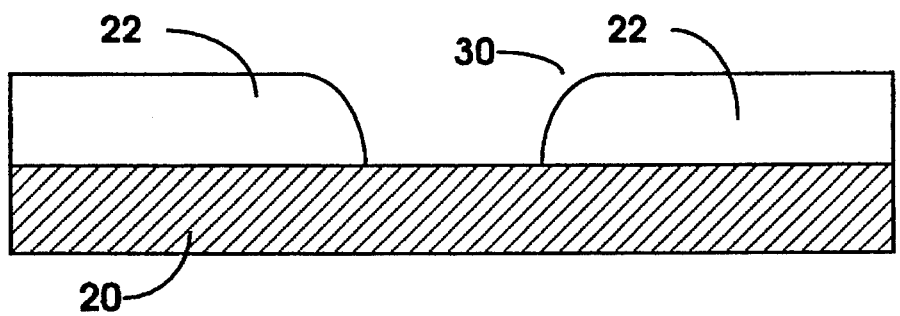

As shown in the drawings, and in particular in FIGS. 5–9, the present invention is concerned with a method for controlling pattern edge profiles in resist or radiation sensitive imaging layers, and for forming three-dimensional structures in resist layers. In accordance with the invention, a resist layer is exposed to a uniform electron beam, either before or after patterning, to provide for different solubilities at different depths in the resist layer. For example, by providing a heavier dose toward the bottom of a positive acting resist, the method produces a developed resist pattern having undercut profiles at the pattern edges. Conversely, by providing a heavier dose toward the top of a positive acting resist, the method produces developed patterns with tapered sidewalls. Another variant of the method is to provide a dosage pattern that is complementary to that of the primary pattern lithography system. Thus the dosage provided by the electron beam compensates for the primary pattern lithography dosage distribution, and the pattern edges can be controlled to achieve vertical sidewalls. More generally, the pattern edges can be controlled to achieve any desired slope of the pattern sidewalls.

Figure 4:
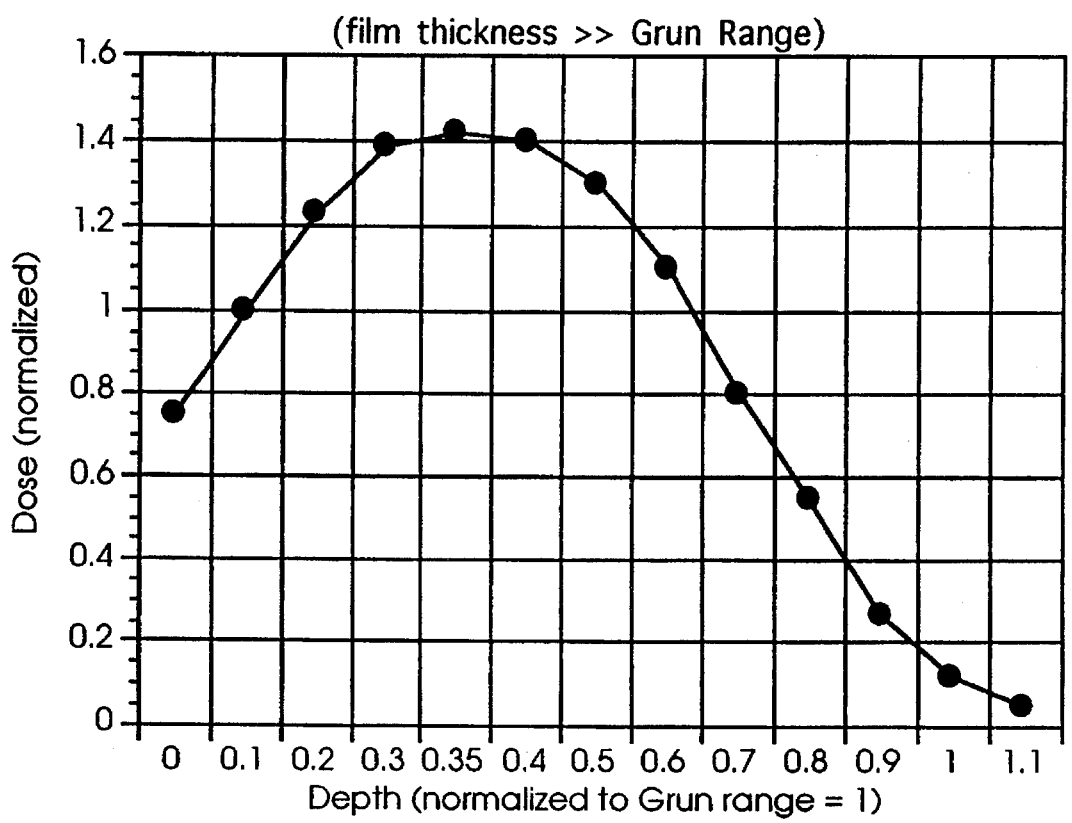
FIG. 4 is a graph showing a typical dose versus depth profile in a relatively thick resist.

The invention depends for its successful operation on the relationship between the dose of an incident electron beam and the depth in a resist layer at which the dose is principally effective. FIG. 4 shows the relationship between dosage and resist depth, in relative terms. When high-energy electrons impinge on a layer of resist material, a number of complex and interrelated reactions take place. The impinging electrons collide with nuclei and electrons of the resist. The electronic collisions are inelastic and slow down the primary electrons, transferring energy to secondary electrons. The impinging electrons produce ions as a result of collisions with molecules, and also have a large number of collisions with other electrons of various energy levels before being absorbed. There is a resulting molecular rearrangement of the ions and excited molecules, the nature of which depends principally on the dose level (controlled by the beam current). At lower doses when irradiating positive photoresists, molecular chain scissions predominate and tend to render the resist material more soluble. Above a certain dose level, molecular crosslinking predominates and the resist material is rendered insoluble.

Figure 13:
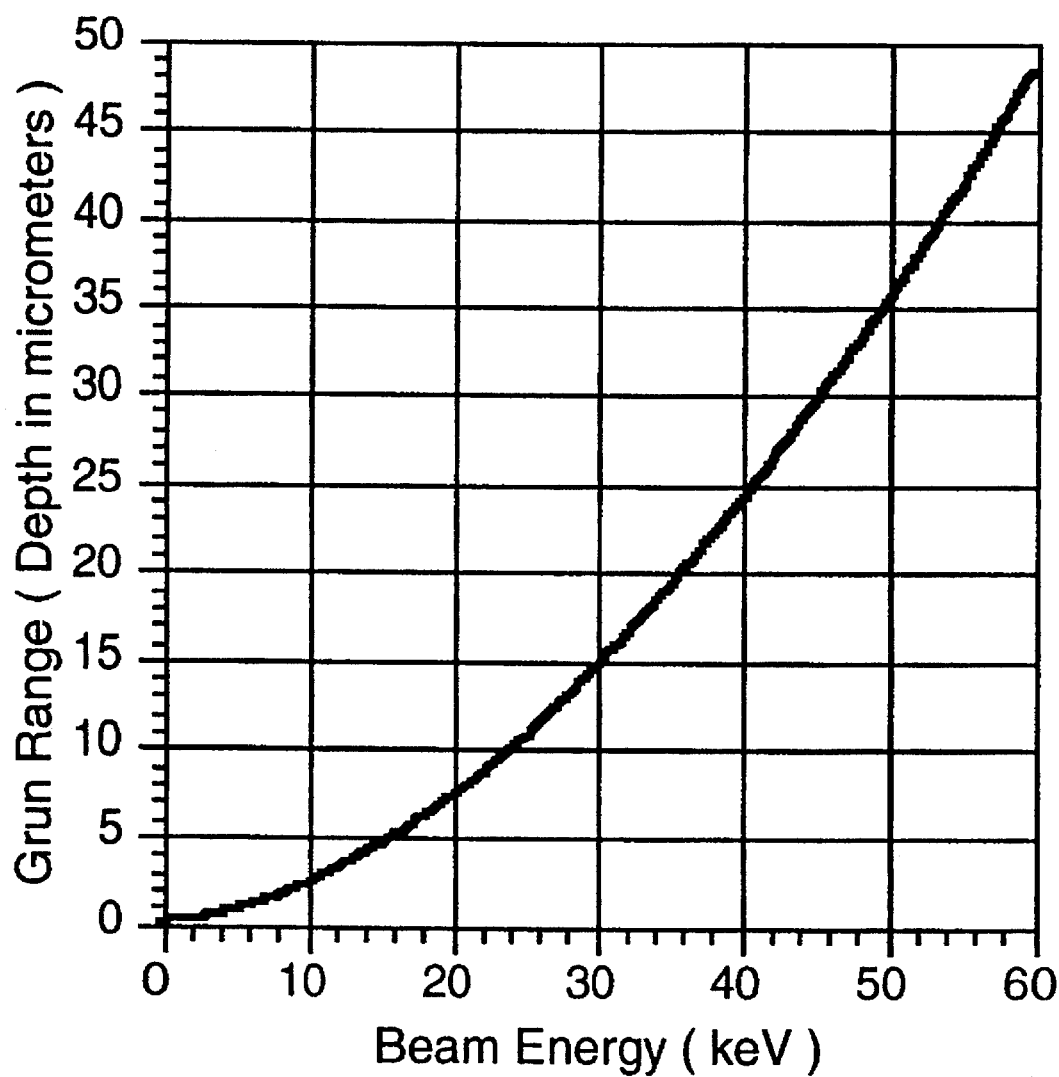
FIG. 13 is a graph showing the relationship between electron beam range (depth) and electron energy.

The depth to which impinging electrons penetrate an irradiated resist layer before being absorbed depends on many factors, one of the most critical of which is the energy of the electron beam, as determined by the accelerating voltage. FIG. 4. shows a typical distribution of electrons (a measure of relative dose) with respect to depth in the resist layer. The impinging electrons penetrate the surface of the resist relatively easily and are absorbed principally at some depth below the surface. A lesser number of electrons is absorbed near the surface, and the density of absorbed electrons tapers off gradually to practically zero at a greater depth. The range (or depth) at which the electron energy is completely dissipated is referred to as the Grun range. FIG. 13 shows the relationship between the Grun range and the beam energy.

Figure 4A:
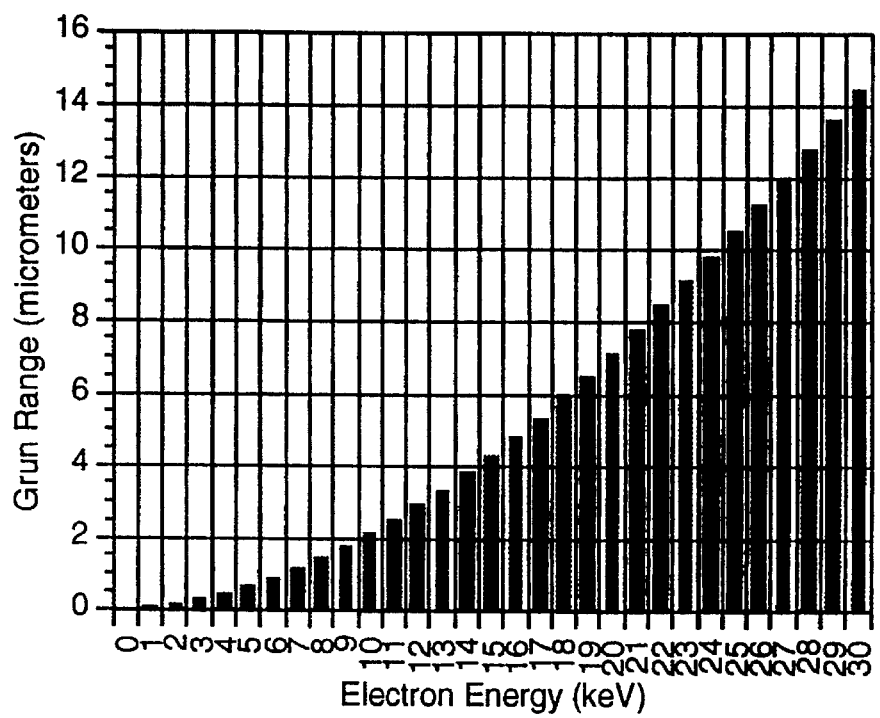
FIG. 4A is a graph showing the relationship between electron energy and the Grun range, which is a measure of the depth of electron penetration in a resist.

The peak in FIG. 4 indicates the region (in terms of relative depth) in which the effect of the electron beam is greatest. As the beam energy (controlled by accelerating voltage) is increased, the center of highest exposure dose is driven further from the top layer of the resist until, at very high energies, this center of highest energy density is driven into the substrate. FIG. 4A shows how the electron beam energy (in keV) affects the Grun range, which is a measure of penetration of the electrons into the resist. Changes in the electron energy affect the depth (in absolute terms) of the peak dose shown in FIG. 4. (The curve shown in FIG. 4 does not change with electron energy, however, because its depth scale is normalized to the Grun range .) One may select a low electron accelerating voltage to expose the top layer of the resist without exposing the bottom layer. And due to the nature of the electron beam scattering process the lower portion of the resist can be exposed to a higher level of dose than the upper level by selecting a sufficiently high incident beam energy. The total dose of electrons affecting the resist at the selected level is controlled by the beam current and exposure time. A relatively low total dose has the effect of rendering a positive resist more soluble. A high dose may completely cure the selected region of the resist and render it insoluble.

In effect, by controlling dose and beam energy the method of the invention provides for selective control of resist solubility at selected depths in the resist. This control in the depth dimension complements the two-dimensional control of solubility provided by patterning of the resist. Solubility control in the depth dimension can be usefully employed to control the edge profiles in the resist pattern, as explained below with reference to FIG. 5. In a more general sense, the ability to control solubility in the depth direction facilitates the structure of three-dimensional resist patterns.

The invention may employ any large-area uniform monoenergetic electron source to irradiate the resist. For example the source may include a glow discharge cold cathode, as disclosed in U.S. Pat. No. 5,003,178, "Large-Area Uniform Electron Source," issued in the name of William R. Livesay.

Figure 5:
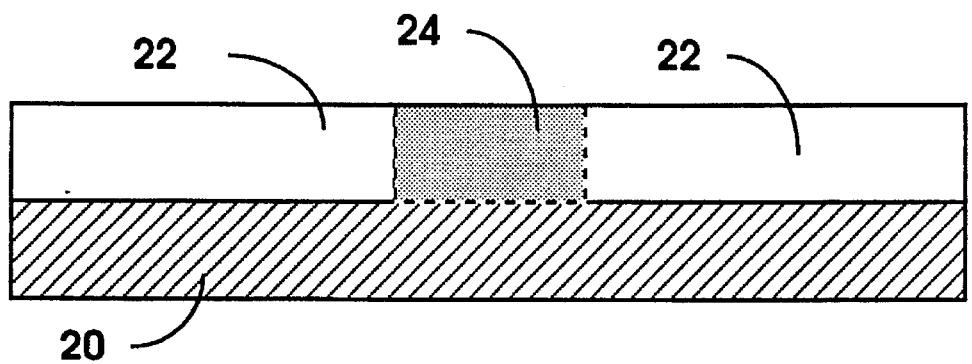
FIG. 5 is a cross-sectional view showing a resist-coated substrate which has been patterned (exposed) but not yet developed.
Figure 6:
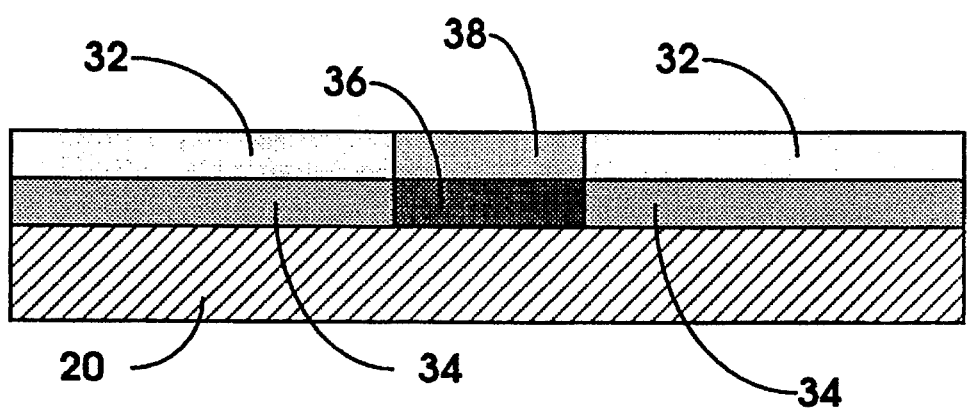
FIG. 6 is a cross-sections view showing the resist of FIG. 5 after it has been flood exposed with electron radiation at two different doses and at two different beam energies, creating a more soluble underlayer than the top layer of resist.

As shown in FIG. 5, a resist-coated substrate 20 is exposed (using any photolithographic technique, such as optical, electron beam or x-ray) in the pattern area 24 to an exposure level referred to in this description as Dose A. If the resist were to be developed conventionally after this primary patterning step, the resist edge profile would be determined by the relative solubilities of the exposed region 24 and the unexposed region 22. However, in one embodiment of the disclosed invention, prior to development the entire resist layer is next exposed to a broad area electron beam, which uniformly irradiates the entire substrate with at least another level or multiple levels of exposure at different depths in the resist. A higher energy (acceleration voltage) electron beam will expose deeper levels of the resist at higher dose than upper layers. By way of example the previously exposed layer of resist in FIG. 5 is shown in FIG. 6 after being subsequently exposed at two different levels in the resist. This is accomplished by utilizing a higher accelerating voltage for the lower portion of the resist, than the upper layer. For example, the upper portion of the resist 32 is exposed to an amount Dose B and the lower portion of the resist 34 to an amount Dose C. In the pattern exposure area 24 the exposures add together such that in the upper portion of the pattern area the exposure dose is Dose A+Dose B and in the lower portion of the pattern area the exposure dose is Dose A+ Dose C.

Figure 7:
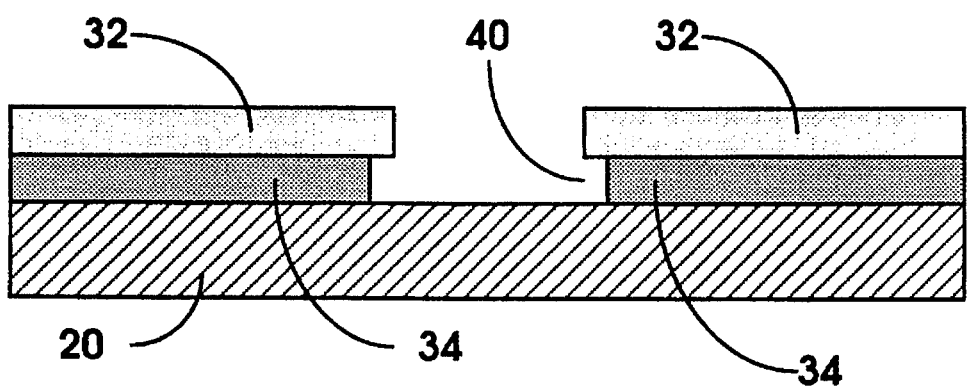
FIG. 7 is a cross-sectional view depicting the subsequently developed resist profile from FIG. 6, with an undercut profile due to the more soluble (more heavily exposed) underlayer dissolving at a faster rate than the less exposed upper layer of resist.

If Dose C is much greater than Dose B, the developed resist profile will be undercut, and not tapered, as shown in FIG. 7. Another way of achieving this result is to use a single blanket exposure of appropriate energy and dose. One can make use of backscattered electrons from an underlying substrate to provide for higher dosage in the lower half of the resist than the upper half. For example, a single blanket exposure can provide a lower-half dose level of 20–30 µC/cm$^2$ and an upper half dose level of 10–15 µC/cm$^2$.

Figure 8:
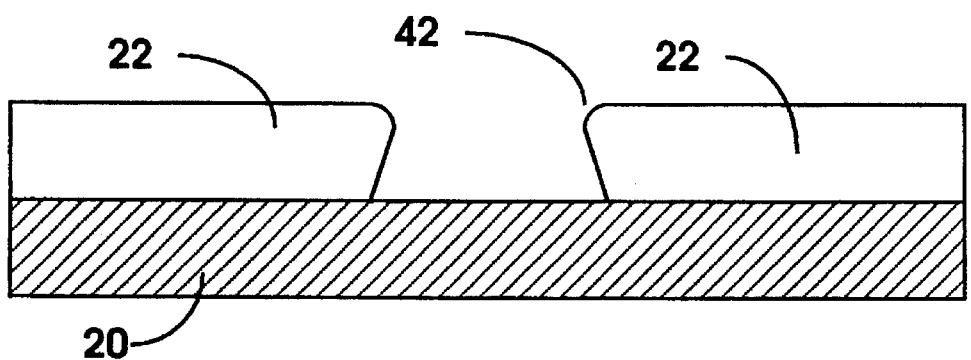
FIG. 8 is a cross-sectional view showing how a uniformly graduated electron beam dose as a function of beam energy (resist thickness) can achieve a smooth undercut edge profile.

Further, by providing a continuous gradation of exposure from the top of the resist to the substrate surface (via electron beam exposure) it can be shown that one may achieve smooth edge profiles like the one shown in FIG. 8. Further, it can be seen that one may achieve vertical sidewalls or any wall slope angle desired by proper selection of the electron beam exposure/resist thickness gradient. This desired exposure gradient is achieved by varying the accelerating voltage of the electron beam used to provide the blanket auxiliary exposure. It should be noted that to expose the lower portion of the resist requires some exposure to the upper level of resist as well. It is evident that this blanket exposure actually makes positive resist more soluble in its developer and therefore would contribute to the erosion of the upper corner edges of the resist. However, it has been found that the amount of exposure required to effect edge control is very small and does not significantly affect the dissolution rate of the resist outside the pattern areas.

In yet another embodiment of the invention, the blanket exposure by the controlled energy electron beam can be patterned using a conformal mask or a free standing template mask. In this embodiment, the controlled energy blanket electron beam is masked by a deposited conformal mask or template mask above the resist. The electron beam then exposes a controlled dose through the open areas of the mask. By depositing a heavier dose in the lower portion of the resist, an undercut resist edge profile can be obtained. By exposing a heavier dose in the upper portion of the resist, tapered sidewalls may be obtained.

Figure 9A:
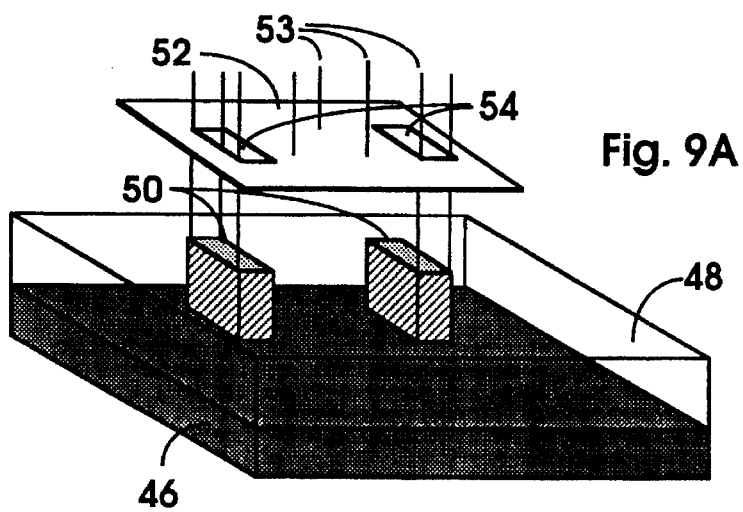
FIGS. 9a–9d are cross-sectional views showing the construction of a three-dimensional bridge in a resist layer.
Figure 9B:
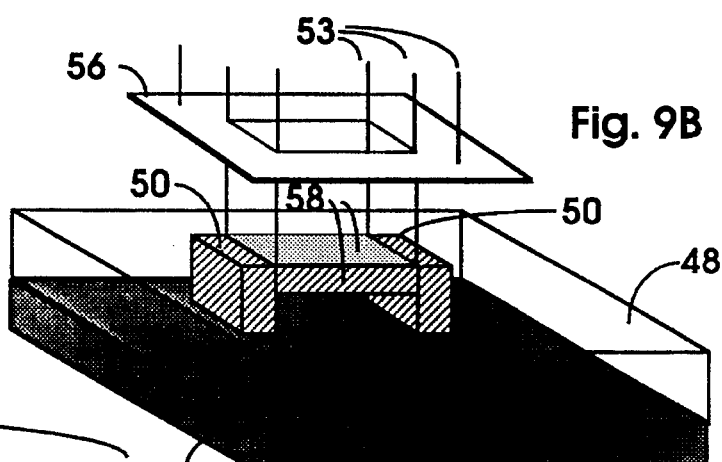
Figure 9C:
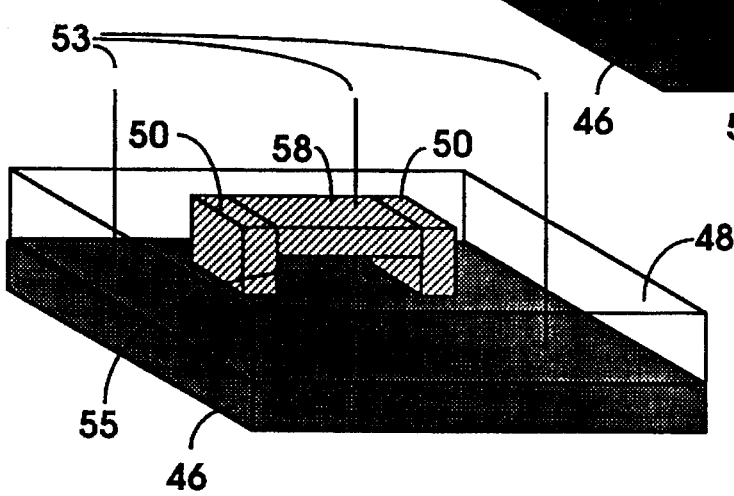
Figure 9D:
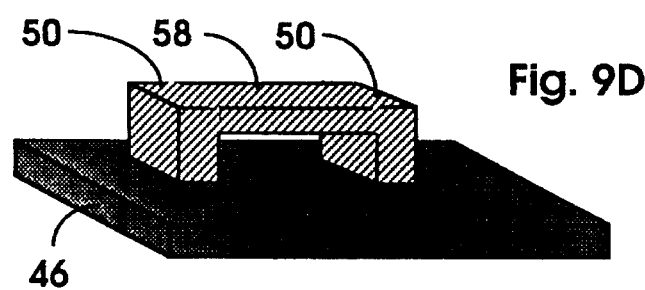

By using multiple masking steps and controlled depth exposures, various microstructures may be fabricated, as shown by way of example in FIGS. 9a–9d, in which a substrate is shown at 46 and the outline of a resist layer (for example 5 µm thick) is shown at 48. In a first processing step, shown in FIG. 9a, selected areas 50 are irradiated through a template mask 52, which masks out undesired portions of the incident electron beam 53. The areas 50 are exposed to a heavy dosage (500–1,000 $\mu C/cm^2$) at a high enough voltage level (18–20 keV) to penetrate down to the substrate level. Then, as shown in FIG. 9b, using another mask 56 an area 58 located between the already exposed areas 50 is exposed to a dose of 500–1,000 $\mu C/cm^2$ at a lower energy level, for example at a 10 keV level, to penetrate up to two microns of resist. The dosage (>500 $\mu C/cm^2$) is chosen to totally cure to make this layer of resist insoluble. Then, with the masks removed as shown in FIG. 9c, the entire wafer is exposed at a high enough energy (18–20 keV) to penetrate the entire resist layer, and at a low dose, on the order of 50–100 $\mu C/cm^2$, which will make the remaining resist soluble in a suitable solvent. This renders the resist soluble everywhere, including under the bridge area 58 of the resist 55. The wafer can then be developed with the region 55 under the bridge 58 being dissolved. Regions of the resist beneath the areas 50, forming pedestals at the end of the bridge area 58, and the bridge area itself, will not be dissolved because of the high dose received in the steps depicted in FIGS. 9a and 9b.

It will be apparent from this example that the method of the invention is a powerful technique for forming three-dimensional structures in conjunction with two-dimensional lithographic processes. The illustrative three-dimensional bridge structure was formed using only two masks and a single resist coating.

Another example of this three-dimensional patterning process is illustrated in FIGS. 10A–10I. FIGS. 10A–10D show how a conventional metal plating process is performed using a patterned resist. A substrate 60 is first coated with a thin starting layer 61 of the metal to be plated onto the structure. The substrate 60 is then coated with a resist layer 62 and exposed or patterned in a photolithographic exposure system. Selected areas, such as the one shown at 63, are exposed to radiation. The resist 62 is then developed, as in FIG. 10B, dissolving away the exposed areas and leaving openings in the resist, such as the opening 64. The patterned resist layer 62 acts as a mask when the substrate is immersed in a plating bath and metal is plated onto the initial layer 61, filling the opening 64 with metal, as indicated at 65 in FIG. 10C. The remaining portions of the resist 62 are then removed and the thin starting layer of metal 61 is etched away, to leave a mesa structure of metal, as shown at 66 in FIG. 10D.

Figure 10A:
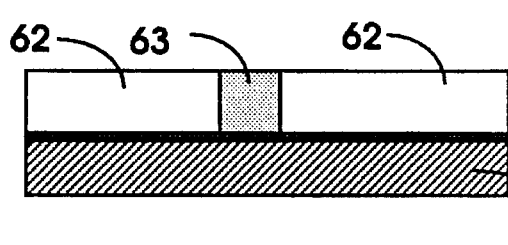
FIGS. 10A–10D are a sequence of cross-sectional views depicting a metal plating process of the prior art.
Figure 10E:
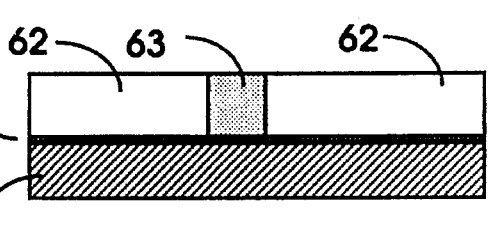
FIGS. 10E–10I are a sequence of cross-sectional views depicting another embodiment of the invention, for forming a three-dimensional metal structure.
Figure 10F:
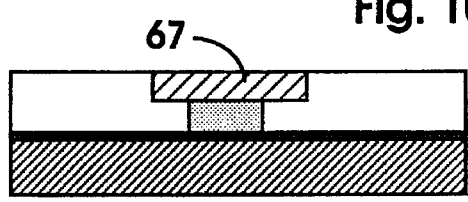
Figure 10B:
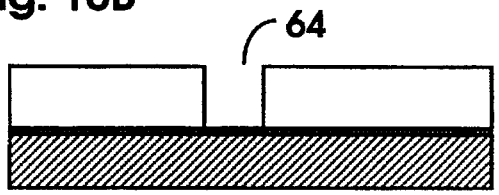
Figure 10G:
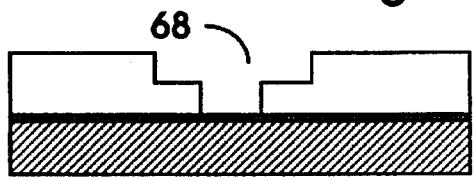
Figure 10C:
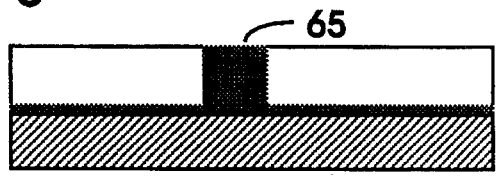
Figure 10H:
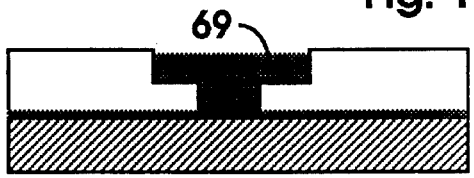
Figure 10D:
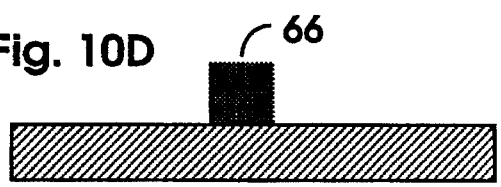
Figure 10I:

The three-dimensional patterning technique of the invention can be usefully combined with the conventional metal plating process described above, as illustrated in FIGS. 10E–10I. FIG. 10E shows a conventionally patterned resist 62, 63, formed over the substrate 60 and starting metal layer 61. As depicted in FIG. 10F, the resist is then further exposed with a controlled energy electron beam through a conformable mask or a template mask (not shown) with an opening slightly larger than the previously exposed area 63 of the resist. The energy of the beam is kept low, for example at approximately 10 keV for a 5 µm thick resist layer 62. Therefore, only the top half (approximately 2 µm) of the resist is exposed (to a dose less than 100 $\mu cm^2$), and a region 67 of the resist becomes more soluble than the remainder of the resist layer. As shown in FIG. 10G, the development step of the process results in removal of both the first exposed region 63 and the further exposed region 67, leaving an irregularly shaped cavity 68, which is wider at the top than at the bottom of the resist layer. The remaining steps of the process, shown in FIGS. 10H and 10I are the same as those shown in the conventional process in FIGS. 10C and 10D. The resist acts as a mask when the substrate is immersed in a plating bath and the metal plates onto the starting layer 61 in the open area of the resist, to form a pedestal structure 69, which remains when the residual resist material and starting metal layer 61 are removed. The process depicted in FIGS. 10E–10I is but one example of how the invention can be used to form a three-dimensional mold for fabricating unusually shaped structures of metal or other materials in the semiconductor fabrication environment.

Figure 11A:
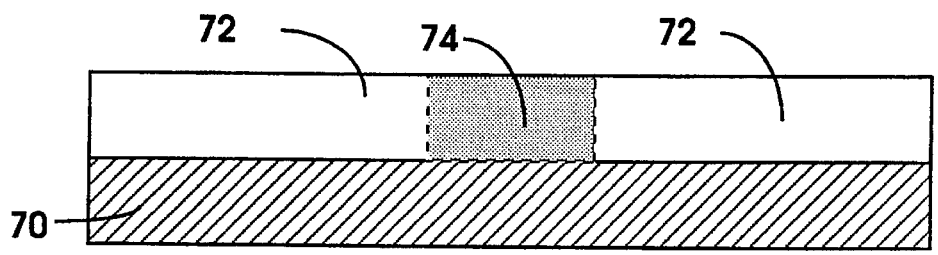
FIGS. 11a–11e are a sequence of cross-sectional views depicting another embodiment of the invention.

Another variant of the technique of the invention, to control wall slopes to provide for tapered undercut profiles in a resist layer is shown in FIGS. 11a–11e. A resist coating, indicated at 72, is first selectively exposed to radiation from an optical projection system or other lithography system. For this purpose, any lithography means may be used to expose the resist 72, which may be either the positive or the negative type. If, for example, the resist is of the positive type, the resist material degrades, or is rendered more soluble, when it is exposed. In FIG. 11a, a central region 74 has been exposed to the radiation and rendered soluble, whereas regions 72 are insoluble to a developer to be applied to the resist in the next processing step.

Figure 11B:
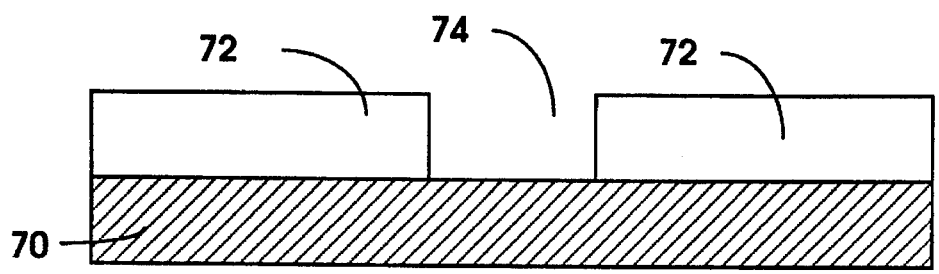
Figure 11C:
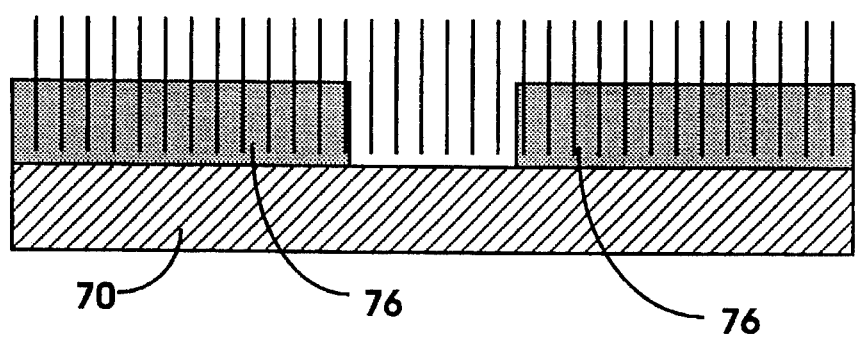
Figure 11D:
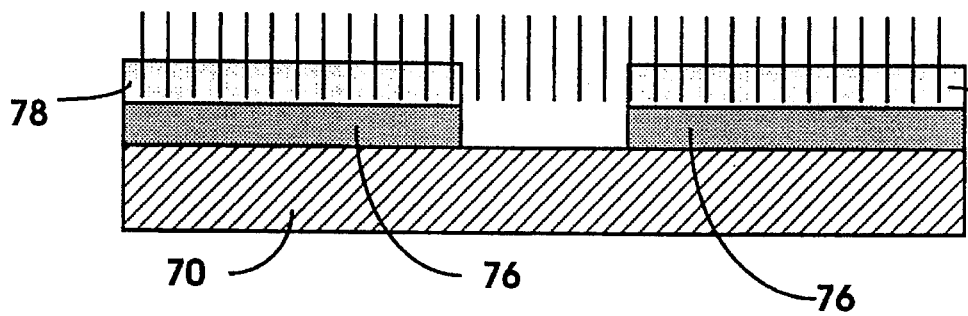

FIG. 11a shows diagrammatically the latent exposure in region 74 and FIG. 11b shows the resultant developed pattern in the resist. After development but prior to any further process step, the substrate and resist are exposed to a broad, large-area electron beam, as indicated in FIG. 11c. For example the source may include a glow discharge cold cathode, as disclosed in U.S. Pat. No. 5,003,178, "Large-Area Uniform Electron Source," issued in the name of William R. Livesay.

Figure 12:
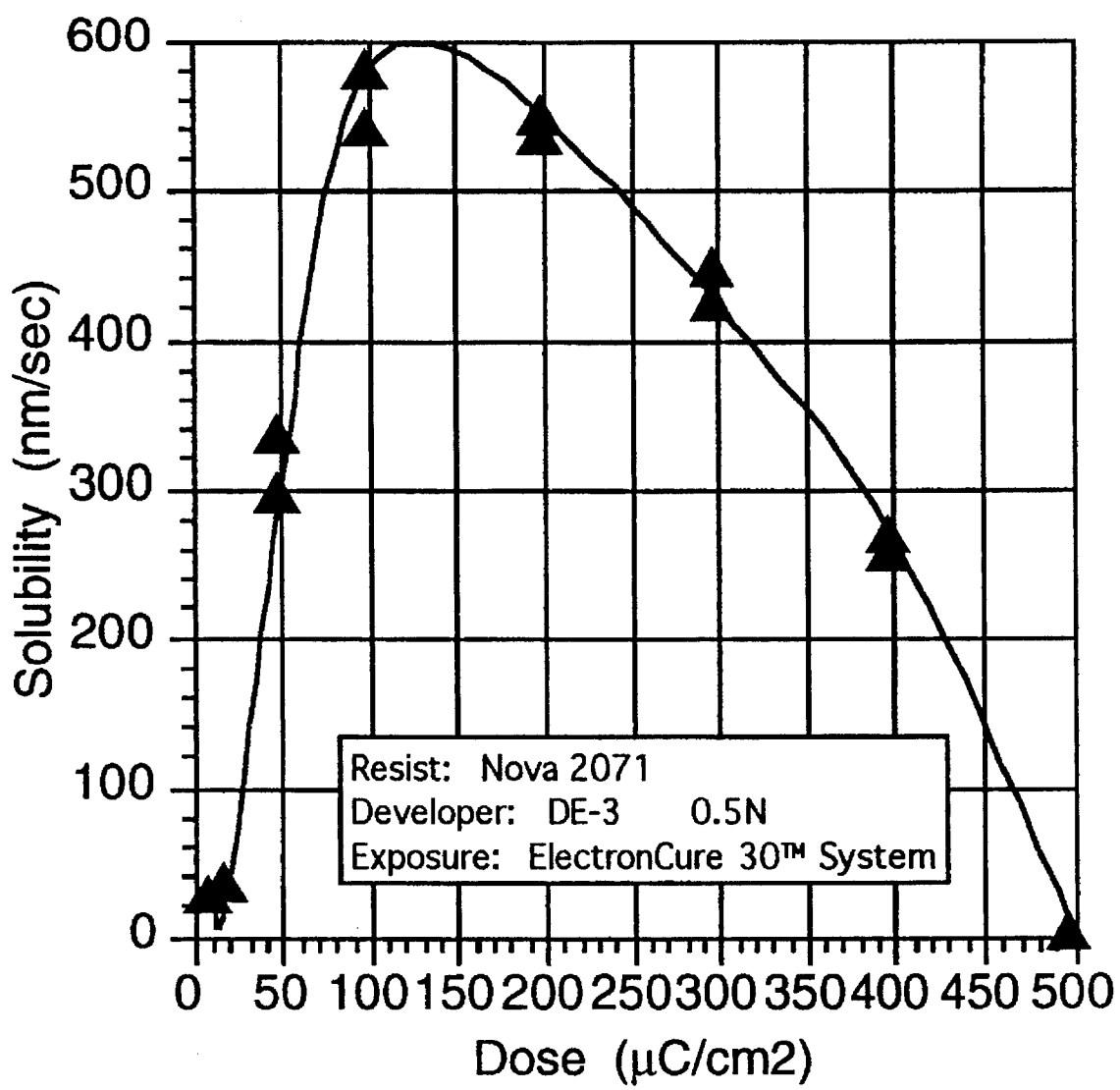
FIG. 12 is a graph showing the relationship between resist solubility and electron beam dose.

As shown in FIG. 12, the solubility of a photoresist material in the developer depends largely on the electron beam dose to which the photoresist is subjected. FIG. 12 shows this variation for a typical diazoquinone Novalak photoresist. The solubility varies from practically zero for a zero electron beam dose to a maximum of about 600 nm/sec at a dose of about 100 to 200 $\mu C/cm^2$. As the dose is further increased above 250 $\mu C/cm^2$, the resist crosslinks to the point where no solvent or developer can penetrate the crosslinked film, and becomes completely insoluble at doses above 500 $\mu C/cm^2$.

As shown in FIG. 11c, the developed resist pattern is exposed to electron beam radiation. The electron accelerating voltage is selected to penetrate the entire resist film (e.g. 28 keV for a resist of thickness 10 µm), and the dose is selected at around 100 µC/cm$^2$, for near maximum solubility through the entire thickness of the resist layer. Then the accelerating voltage is reduced (e.g. to 12 keV) such that the electron beam penetrates only the upper half of the resist layer, as shown diagrammatically in FIG. 11d. This electron beam radiation is continued until the upper half of the resist layer has received a dose in excess of 500 µC/cm$^2$, thus ensuring that the upper half of the resist layer is completely insoluble in the developer.

Figure 11E:
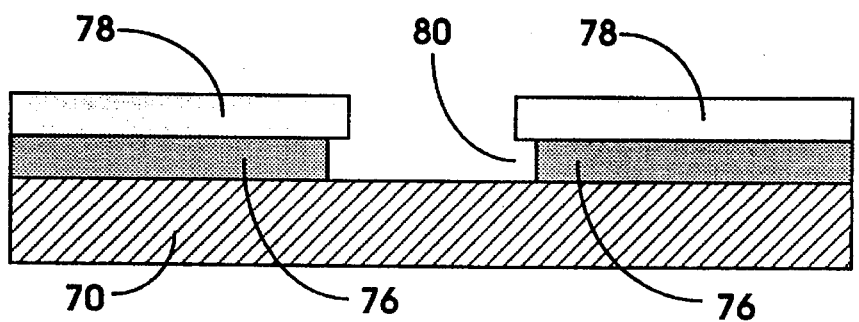

Finally, as indicated in FIG. 11e, the substrate is immersed again in the developer. Since only the lower half of the resist layer is soluble, having received a lower electron dose, a well defined undercut is provided in resist pattern. The electron beam accelerating voltage and electron beam range can be controlled to the point that the depth of the insoluble portion of the resist layer can be predicted very accurately. Therefore, the technique accurately controls the undercut profile by selecting the thickness of the soluble and insoluble layers in the resist. FIG. 13 plots the range of the electron beam (the Grun range) in relation to the beam energy measured in keV. As described above, FIG. 4 shows a typical distribution of electron dose as a function of depth in the resist layer. By combining the depth dose function (FIG. 4) and the solubility curve (FIG. 12), one can predict the actual uncertainty or tolerance of control of the insoluble layer thickness as being only a few hundred angstroms. Therefore, this technique provides a powerful tool for defining resist edge profiles very precisely.

The thickness of the undercut ledge (the upper portion of the resist layer) is determined largely by the accelerating voltage during the high-dose electron beam radiation (FIG. 11d), and not by the strength of the developer or time of exposure to the developer. The lateral dimension of the undercut (the ledge width) is determined by the dose of the first blanket exposure (FIG. 11c) and by the strength and length of time in the final developing step (FIG. 11e). Therefore, the ledge thickness and width are independently and accurately controllable to provide a desired undercut slope. Further, for even more precise slope control, the resist may be selectively exposed to electron beam radiation using more than two layer thicknesses, each of which has a different resultant solubility in the developer. Multiple layers of graduated solubilities produce a smoother undercut slope, at the cost of additional processing steps. However, one may also consider the step shown in FIG. 11d to be one in which accelerating voltage is gradually reduced from the one used in the blanket exposure of FIG. 11c, producing a continuously varying solubility from the bottom to the top of the resist layer.

The exposure of the upper layer of resist to make it insoluble, can also partially expose the uncovered sloping side walls of the resist. These side walls receive a fraction of the dose received by the upper layer, in proportion to the cosine of the angle of the sloping side walls to the horizontal. Thus, perpendicular side walls receive virtually no radiation, walls sloping at 60° receive a 50% dose, and so forth. In addition, some electrons are backscattered from the uncovered substrate and these also contribute to a surface dose along the sloping walls. This can tend to make these walls less soluble than the soluble resist underlayer. However, by adjusting the solubility exposure (i.e., the first electron beam exposure at high energy levels) one can achieve the result of fully dissolving the sloping side walls when the desired amount of undercut is achieved. As a further refinement of the process one can envision tilting the sample at an angle to the incident electron beam to create tunneled holes or different amounts of undercut from one side of a lithography feature to the other.

Although the foregoing steps have been described for use with a positive resist, it will be understood that the technique may be easily adapted for use with a negative resist, i.e., one which becomes less soluble to developer when exposed to radiation. For a negative resist, the step of FIG. 11c is omitted, since the entire resist layer is already soluble. One need only perform the step shown in FIG. 11d, exposing the upper portion of the resist layer to make it less soluble and leaving the lower portion of the resist in its more soluble form.

It will be appreciated from the foregoing that the present invention represents a significant advance in the processing of resists. Specifically, the invention provides a method of exposing a resist coated substrate with an electron beam to distribute varying amounts of exposure at specific depths in the resist. The invention can therefore be used to control the pattern edge profiles of the developed patterns, or to form desired three-dimensional structures of resist, metal, and other materials. The electron beam exposure may be performed before or after the patterning exposure of the resist. In some applications, the electron beam exposure may be performed after development of the resist, and then followed by an additional development step. Moreover, the invention is independent of whether the patterning exposure is performed with an optical, x-ray or electron beam.

It will also be appreciated that, although a number of specific embodiments of the invention have been described in detail for purposes of illustration, various modifications may be made without departing from the spirit and scope of the invention. Accordingly, the invention should not be limited except as by the appended claims.

I claim:

1. A method for controlling solubility of a resist to selected solvents, comprising the steps of:

patterning the resist using a selected lithography process;

exposing the resist with a uniform blanket electron beam;

controlling the energy of the electron beam, to select the depth within the resist at which the electron beam is most effective, the controlling step including selecting an electron beam energy appropriate to a desired depth of effective electron dose, wherein a higher energy beam produces a maximum electron dose relatively deep in the resist, and a lower energy beam produces a maximum electron dose near the surface of the resist;

controlling electron dosage at the selected resist depth, thereby effecting a desired change in solubility at the selected resist; and thereby forming layers of selected solubility within the resist, to produce a desired edge profile in the patterned resist.

2. A method as defined in claim 1, and further comprising:

placing at least one mask in the path of the electron beam, to define a pattern of a desired three-dimensional microstructure to be formed in the resist; and performing a sequence of electron beam exposure steps and developing steps to form the three-dimensional microstructure.

3. A method for controlling edge profiles and pattern dimensions in a lithography process, the method comprising the steps of:

coating a substrate with a resist;

forming a pattern in the resist using the lithography process;

exposing the resist to a uniform electron beam;

controlling the electron beam energy and dose so as to expose layered portions of the resist to selected degrees, thereby controlling the resulting developed edge profiles in the resist; and developing the resist to remove unwanted portions of the pattern.

4. A method as defined in claim 3, wherein:

the step of exposing the resist to the uniform electron beam is performed prior to forming the in the resist.

5. A method as defined in claim 3, wherein:

the step of exposing the resist to the uniform electron beam is performed after forming the pattern in the resist.

6. A method as defined in claim 3, wherein:

the step of exposing the resist to the uniform electron beam is performed after the developing step.

7. A method as defined in claim 3, wherein the step of controlling the electron beam energy and dose includes:

selecting a higher dosage for exposure of lower layers of the resist than for upper layers of the resist, whereby the lower layers are rendered more soluble and produce an undercut edge profile during the developing step.

8. A method as defined in claim 3, wherein the step of controlling the electron beam energy and dose includes:

selecting a higher dosage for exposure of upper layers of the resist than for lower layers of the resist, whereby the upper layers are rendered more soluble and produce a tapered edge profile during the developing step.

9. A method as defined in claim 3, wherein the step of controlling the electron beam energy and dose includes:

selecting a dosage for exposure of each of several layers of the resist such that the layers are removed at different rates during the developing step, to produce a desired edge profile in the resist.

10. A method as defined in claim 3, wherein the step of controlling the electron beam energy and dose includes:

selecting a dosage for exposure of each of several layers of the resist such that the layers are irradiated in a manner complementary to the effect of the step of forming a pattern on the resist by lithography, whereby the layers are removed at different rates during the developing step, to produce a vertical sidewall profile in the resist.

11. A method as defined in claim 3, wherein the uniform electron beam exposure is effected with a large area electron beam that covers the entire substrate.

12. A method as defined in claim 11, wherein the large area electron beam source is a gas discharge cold cathode.

13. A method as defined in claim 3, wherein the exposure dose at each electron energy level is controlled by monitoring the amount of charge reaching the substrate.

14. A method for forming a three-dimensional structure, comprising the steps of:

forming a resist layer on a substrate;

selecting regions of the resist layer, each region being defined by its position and extent in three dimensions within the resist layer;

exposing the selected regions to selected doses of electrons from a uniform blanket electron beam, to effect a change of solubility of the selected regions; and developing the resist to remove unwanted portions and leave a desired three-dimensional resist structure.

15. A method as defined in claim 14, wherein:

the step of selecting regions includes selecting a first portion of the resist that is to remain in the resist structure and selecting a second portion of the resist that underlies the first and is to be removed in the developing steps; and the step of exposing the selected regions to selected doses of electrons includes exposing the first region to a sufficient dosage to render it insoluble, and exposing the second region to a sufficiently small dosage to render it soluble in the developing step.

16. A method as defined in claim 15, wherein:

the step of selecting regions includes interposing a mask in the path of the uniform electron beam before the beam reaches the resist layer, to select the regions in two dimensions; and the step of exposing the selected regions includes controlling the energy of the electron beam to select the depth of the regions in the resist layer.

17. A method as defined in claim 14, wherein:

the three-dimensional resist structure includes a cavity in the resist layer; and the method further comprises filling the cavity with another material and then removing the resist layer, to leave a three-dimensional structure of the other material.

18. A method as defined in claim 17, wherein:

the other material is a metal.

19. A method for forming a three-dimensional metal structure on a substrate, comprising the steps of:

forming a thin metal layer on a substrate;

forming a resist layer over the thin metal layer;

selecting regions of the resist layer, each region being defined by its position and extent in three dimensions within the resist layer;

exposing the selected regions to selected doses of electrons from a uniform blanket electron beam, to effect a change of solubility of the selected regions;

developing the resist to remove unwanted portions and leave a desired three-dimensional cavity extending through the resist layer to the thin metal layer;

plating metal into the substrate, to fill the cavity and bond to the thin metal layer; and removing remaining portions of the resist layer and the thin metal layer, to leave a desired three-dimensional metal structure in the shape of the cavity.

20. A method for producing a desired edge profile in a resist layer formed on a substrate, the method comprising the steps of:

(a) forming a resist layer on the substrate;

(b) patterning the resist layer using a selected lithography process to produce at least one opening in the resist layer, wherein the resist layer has generally perpendicular exposed edges around the at least one opening;

(c) exposing the resist layer to a blanket electron beam of sufficient energy to penetrate the entire layer, at an electron dose selected to render the entire layer highly soluble to a developer, wherein this step (c) is performed only if the resist layer is a positive resist;

(d) exposing the resist layer to a blanket electron beam of sufficient energy to penetrate only a selected upper portion of the resist layer, at an electron dose selected to render the selected upper portion insoluble to the developer; and (e) immersing the substrate and the resist layer in the developer for a time selected to remove exposed edges of the resist layer, but only below the upper portion that has been rendered insoluble by the preceding step (d), leaving the upper portion as a resist layer ledge that extends into the at least one opening;

whereby the resist layer has a desired undercut edge profile.

21. A method as defined in claim 20, and further comprising the following steps performed in conjunction with exposing step (d):

controlling electron energy by varying accelerating voltage, to control the depth of electron penetration into the resist layer; and controlling total electron dosage by varying the time of exposure at each electron accelerating voltage;

whereby a selected solubility profile is obtained across the thickness of the resist layer.

22. A method as defined in claim 21, wherein:

the step of controlling the electron energy provides an electron energy of approximately 28 keV for exposing step (c), if needed, and an electron energy of approximately 12 keV for exposing step (d); and the electron dose during the first exposing step (c) is approximately 100 $\mu C/cm^2$, for maximum solubility, and during the second exposing step (d) is in excess of approximately 500 $\mu C/cm^2$, for minimum solubility.

23. A method as defined in claim 20, wherein exposing step (d) includes:

selecting an electron accelerating voltage to produce an insoluble resist layer ledge of a desired thickness.

24. A method as defined in claim 20, wherein immersing step (e) includes:

selecting the duration of the immersion step to produce an undercut edge of desired lateral dimensions.

* * * * *

UNITED STATES PATENT AND TRADEMARK OFFICE
CERTIFICATE OF CORRECTION

PATENT NO. : 5,468,595
DATED : November 21, 1995
INVENTOR(S) : William R. Livesay It is certified that error appears in the above-indentified patent and that said Letters Patent is hereby corrected as shown below:

In column 10, line 52 after "resist" insert -- depth--.
In column 11, line 13 after "forming the" insert --pattern --.

Signed and Sealed this

Twelfth Day of November, 1996

Attest:

BRUCE LEHMAN

Attesting Officer          Commissioner of Patents and Trademarks